United States Patent [19]

Evans

[11] 3,928,808

[45] Dec. 23, 1975

[54] ANALOG VOLTAGE GENERATORS FOR TELEVISION TUNERS

[75] Inventor: Wayne Wheeler Evans, Carmel, Ind.

[73] Assignee: RCA Corporation, New York, N.Y.

[22] Filed: Jan. 18, 1974

[21] Appl. No.: 434,402

[52] U.S. Cl............. 325/464; 334/14; 340/347 DA

[51] Int. Cl.[2]............ H04N 5/50

[58] Field of Search........... 325/462, 464, 465, 459; 334/15, 16; 340/347 DA

[56] References Cited

UNITED STATES PATENTS

| | | | |
|---|---|---|---|
| 3,568,112 | 3/1971 | Thomas | 325/464 |
| 3,758,864 | 9/1973 | Kanamaru | 325/465 |
| 3,810,022 | 5/1974 | Collins | 325/459 |

*Primary Examiner*—George H. Libman

*Attorney, Agent, or Firm*—E. M. Whitacre; P. M. Emanuel

[57] ABSTRACT

A voltage controlled television tuner may be tuned to each of the available channels within its tuning range by providing first and second analog voltage generators responsive to digital channel commands for producing the requisite tuning voltages. The first analog voltage generator provides one or more output voltage ranges, each range corresponding to, for example, a decade of channel frequencies. The second analog voltage generator subdivides the voltages provided by the first generator into voltages corresponding to individual channels, providing thereby the tuning voltages for the voltage controlled tuner.

18 Claims, 4 Drawing Figures

CONTROLLABLE REFERENCE SUPPLY

ANALOG VOLTAGE GENERATORS FOR TELEVISION TUNERS

This invention relates to tuning systems for television receivers and, more particularly, to an analog voltage generating channel address system suitable for use with a voltage controlled tuner.

Television receivers employing voltage controlled tuners may be tuned to a desired channel frequency by applying a frequency-related tuning voltage, for example, to voltage variable capacitors in the tuner. A typical television receiver employing such a tuning system may utilize a plurality of parallel-connected potentiometers or resistor dividers, one for each channel, coupled across a regulated power supply to provide the requisite tuning voltages for the individual channels. A selecting device such as a series of push buttons or a multiple position rotary switch can then be utilized to select individual potentiometers or resistor dividers corresponding to particular channels. The voltage outputs from these dividers or potentiometers are coupled to the voltage controlled tuner in the television receiver and signals transmitted on the desired channel are thereby received.

Tuning systems such as the one described above have the disadvantage of requiring a voltage divider and an individual push button or channel selector switch for each desired channel.

In order to provide further ease and equality of tuning of a large number of channels, systems have been developed that include ten push buttons to select any one of the available channels, for example, any one of the 82 channels available in the United States. The latter systems are constructed with digital to analog (D/A) converters and a digital channel address system. By selecting two channel-number-representative digits by means of the ten available push buttons, logic circuitry is arranged to couple the analog voltage output of a particular one of the D/A converters to the voltage controlled tuner in the television receiver. The logic circuitry further operates to cause the output of the selected D/A converter to coincide with the voltage required to tune the voltage controlled tuner to the desired television channel. In such a tuning system, channel selection of certain ones of the channels, for example, the UHF channels 14 through 83 may be accomplished by having a first digital to analog converter responsive to the tens portion of the channel command signal which provides first and second output lines having a voltage difference corresponding substantially to the range of tuning voltages required to tune a decade of channels. A second D/A converter is coupled across the first and second output lines of the first D/A converter and the voltages corresponding to the decade of channels are subdivided by the second D/A converter into voltages corresponding to ten individual channels within the decade. By selecting the desired decade and the desired units digit, any channel in the range (e.g., 14 to 83) may be selected. A detailed description of such a channel address system may be found in my copending application entitled, TELEVISION TUNING SYSTEM, Ser. No. 434,383, assigned to RCA Corporation.

In the construction of a tuning system to cover a large number of channels such as channels 14 to 83, it is desirable to employ a system which will present a relatively small current load to an associated reference voltage supply while providing a relatively low output impedance for driving the associated voltage controlled tuner. The former requirement is imposed to insure desired stability of the reference supply while the latter is a requisite for stability of the tuner.

It is therefore desirable to minimize the number of individual D/A converters coupled to the reference supply. Furthermore, in the construction of a tuning system to cover a large number of channels such as channels 14 to 83, it is desirable to provide D/A converters that may be adjusted to accommodate the nonlinear tuning response curve of many different tuners. In the current art of tuner production, it is possible to have a tuner that requires a lower voltage to tune, for example, channel 80 than another tuner requires to tune channel 70. In order to accommodate such a broad range of tuning voltages, it is necessary to provide variable voltage controls that will allow wide voltage deviations that are wide enough to accommodate the voltage requirements of different tuners and narrow enough to allow adjustment without excessive sensitivity.

In accordance with the present invention, a television tuning system that provides a relatively low cuurrent drain to a reference source incorporates first and second resistor ladder networks having a plurality of output terminals. The input terminals of these ladder networks are coupled to a source of reference voltage. The reference voltage is divided at the output terminals into predetermined voltage levels. A third ladder network having a plurality of output terminals is coupled to ones of the output terminals of the respective first and second networks. This third resistor ladder network further subdivides the voltage supplied to it. A channel selection means is coupled to the three ladder networks and selectively couples output terminals of the first and second ladder networks to input terminals of the third ladder network. The channel selection means also couples a particular output of the third ladder network to a voltage controlled tuner.

A better understanding of the invention may be derived from the following detailed description in connection with the accompanying drawing in which.

Figure 1:
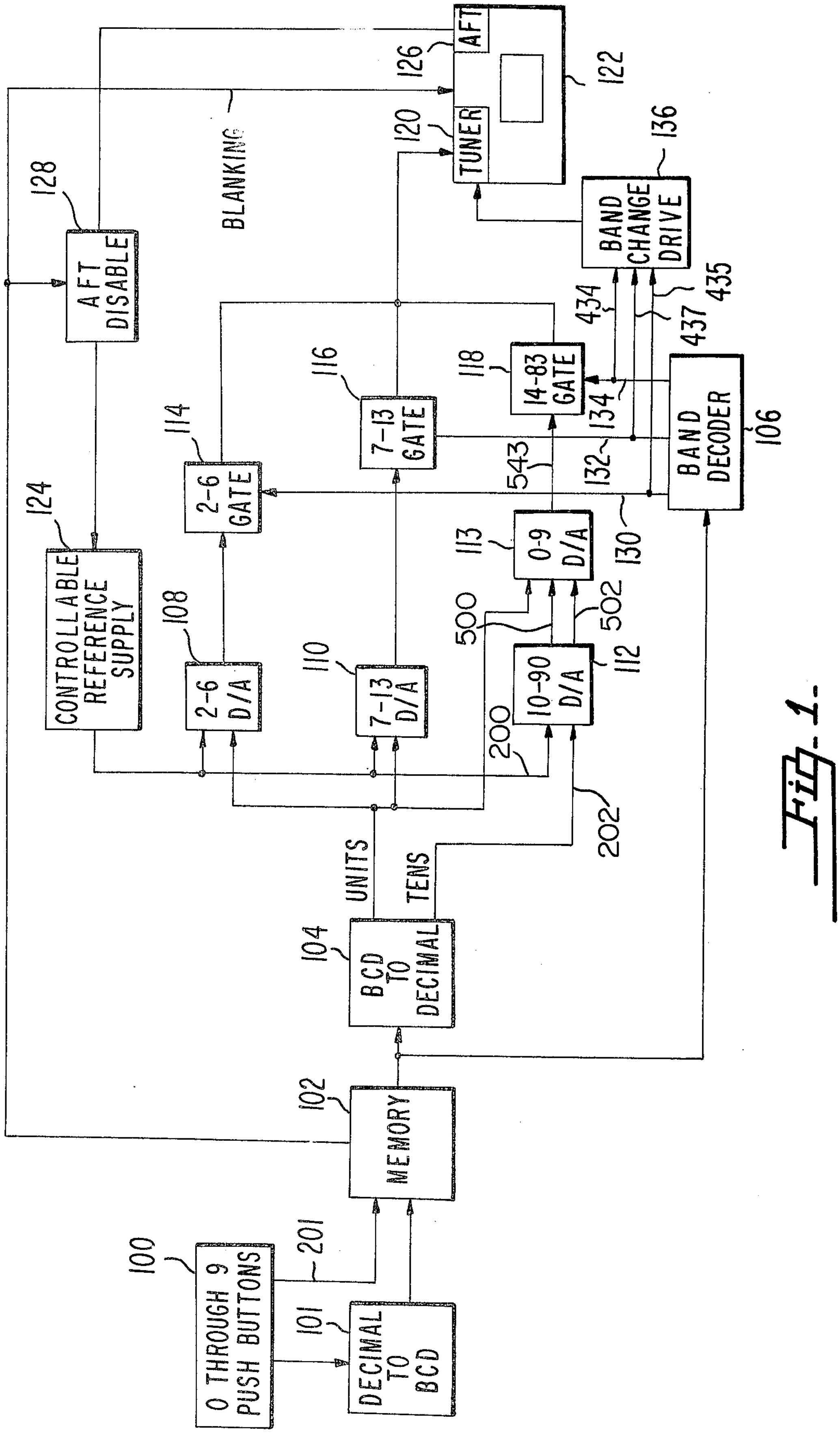
FIG. 1 is a block diagram of a television tuning system incorporating the invention.

With reference to FIG. 1, an assembly including ten push button switches 100 (labelled 0 through 9) has buttons one through nine coupled to a decimal to binary-coded decimal (BCD) converter 101. The push button assembly 100 may be of the type commonly employed in small electronic calculators. The output of converter 101 is coupled to a memory 102 wherein numerical representative electrical signals are stored. A separate line 103 from assembly 100 couples a zero digit contact directly to memory 102.

Memory 102 is coupled to a BCD to decimal decoder 104 and also to a band decoder 106. A numerical display (not shown) may also be coupled to memory 102 for providing a display of the selected television channel number. Three digital to analog (D/A) converters 108, 110 and 113 are coupled to a units output of decoder 104. A fourth D/A converter 112 is coupled to a tens output of decoder 104. Transfer gates 114, 116 and 118 are coupled to the respective outputs of digital to analog (D/A) converters 108, 110 and 113. The output terminals of transfer gates 114, 116 and 118 are coupled in common to a voltage controlled tuner 120 associated with a television receiver 122. Tuner 120 may include separate UHF and VHF tuner portions such as the RCA model KRK 194 UHF tuner and the RCA KRK 155 VHF tuner which are shown in RCA Television Service Data, File 1973, C-10, published by RCA Corporation, Indianapolis, Indiana. Each of the above-named tuners utilizes varactor tuning elements to control tuner frequency but it should be recognized that other types of voltage controlled tuners may be used as well.

Band decoder 106 has three output lines 130, 132 and 134 respectively coupled to control terminals of transfer gates 114, 116 and 118 and to input terminals on band change drive circuit 136. Drive circuit 136 is coupled to tuner 120 and provides the necessary voltage levels to switch frequency bands in tuner 120.

A controllable source of reference voltage 124 is coupled to D/A converters 108, 110 and 112 and provides a voltage level from which analog tuning signals are derived. An automatic fine tuning (AFT) circuit 126, for example, of the type shown in the above-referred Service Data 1973, No. C-10, located within television receiver 122 is coupled to the controllable reference source 124 through an AFT disable circuit 128. AFT circuit 126 provides a signal for modifying the output voltage from the source of reference voltage 124.

A blanking output from memory 102 is coupled to receiver 122 and to AFT disable circuit 128 for inhibiting operation of such circuits as AFT, sound and video during channel change.

In the operation of the system shown in FIG. 1, one of the buttons of assembly 100, representative of the tnes digit of the desired television channel, is depressed. Although assembly 100 is referred to as having push button switches, other type devices which provide contact closure or electrical circuit closure may be used. If the desired channel is any one of channels 2 through 9, a tens digit is indicated by the depression of the zero (0) button. If the desired channel is any one of those in the range of channels 10 through 83, a corresponding tens digit of one through eight (1–8) is depressed. Depression of one of the buttons one through nine of assembly 100 produces a signal on one of nine lines (shown diagrammatically as a single line) at the output of assembly 100, which signal is coupled to decimal to BCD converter 101. A signal is coupled directly to memory 102 through a tenth line 103 if the digit button which is depressed is zero. Converter 101 converts the signal derived from button assembly 100 into a binary coded decimal (BCD) number and transfers it to a tens register in memory 102 (details of which will be explained below referring to FIG. 2). Upon entry of a first digit of the two digit channel command into memory 102, a blanking signal is supplied from memory 102. This blanking signal operates to blank the displayed image, to mute the sound of television receiver 122 and to disable the output of AFT signals from AFT circuit 126. AFT signals are disabled during channel change to allow channel change without any effect by the AFT signals.

To complete the channel selection command, a units digit 0 through 9 is selected. The selected button of assembly 100 is depressed, providing a signal on the appropriate one of the 10 associated output lines. As before, if the number is any of the numbers one through nine, converter 101 converts the signal from button assembly 100 to a BCD number and memory 102 stores this number in an associated units register. A zero is coupled directly to memory 102. Upon receiving this second (units) digit command, memory 102 unblanks the video and sound in television receiver 122 and enables the AFT.

Eight output lines (shown as a single line) representing the tens and units BCD numbers in memory 102 are coupled to BCD to decimal decoder 104 and to band decoder 106. Band decoder 106 decodes the BCD numbers supplied from memory 102 and provides output signals on one of three output lines to indicate that the selected channel lies in a particular band of channels, for example, channels 2 through 6 for band 1, channels 7 through 13 for band 2 and channels 14 through 83 for band 3. Additional output lines and decoding circuitry may be added to decoder 106 for providing output signals corresponding to other bands, for example, channels 84 through 89 and 90 through 99, which may then correspond to channels used for other functions such as cable television. Output lines 130, 132 and 134 from band decoder 106 are respectively coupled to the control terminals of transfer gates 114, 116 and 118 and provide signals to selectively operate one of these gates in response to a channel command. Gates 114, 116 and 118 operate to pass a selected one of the simultaneously derived analog tuning voltages developed respectively by D/A converters 108, 110 and 113 to tuner 120.

BCD to decimal decoder 104 decodes the eight BCD lines provided by memory 102 into twenty lines (shown diagrammatically as two lines labelled "units" and "tens"), the first ten of which correspond to a tens digit and the second ten of which correspond to a units digit. The unit lines of decimal decoder 104 are coupled to D/A converters 108, 110 and 113 and provide a numerical representative signal which is to be converted into an analog voltage. Similarly, the tens lines from decimal converter 104 are coupled to D/A converter 112 providing the tens digit signal to be converted into an appropriate analog voltage. It is not necessary to provide a tens line to D/A converter 110 since the seven channel numbers in the range of 7 to 13 can be uniquely selected with an appropriate units digit and the necessary band selection signal (e.g., channel eight may be represented by eight, while channel 12 may be represented uniquely by its unit digit two). A detailed explanation of the operation of the associated D/A converters is given later in this specification with reference to FIG. 4. The analog voltages derived from D/A converters 108 and 110 correspond, respectively, to the tuning voltages required to tune tuner 120 to channels 2 through 6 and 7 through 13. In tuning tuner 120 to channels 14 through 83, however, two D/A converters are utilized in order to derive the requisite tuning voltages. D/A converter 112 is responsive to the tens digit portion of the channel command and provides two voltage outputs which correspond to the end channels of a tuning range of eleven channels, i.e., 10–20, 20–30, etc. The voltages provided by converter 112 are further subdivided by converter 113 into voltages corresponding to individual ones of ten channels within the selected eleven channel tuning range. Converter 113 is responsive to the units digit of the channel command and provides a tuning voltage at its output corresponding to a selected channel in the range of 14 through 83.

In order to provide the requisite analog tuning voltages, D/A converters 108, 110 and 112 receive a reference voltage from reference source 124. Reference source 124 contains a relatively constant voltage supply and associated circuitry to allow the voltage provided at the output terminal of source 124 to be modulated by the automatic fine tuning voltage (AFT) developed in television receiver 122. AFT voltage developed in television receiver 122 is responsive to the deviation in frequency between the received television signal carrier wave and the frequency to which the television receiver is tuned. Typically, this frequency deviation is sensed in terms of a difference between the frequency of the converted intermediate frequency picture carrier and a fixed tuned circuit. This AFT voltage is coupled to and operates to change the voltage coupled from reference supply 124 to the D/A converters 108, 110 and 112. The voltage provided by reference supply 124 varies in response to the AFT voltage to change the tuning voltage to tuner 120 and thereby minimize the frequency error between the tuner frequency and the received signal. A detailed explanation of controllable reference source is given below with reference to FIG. 2.

Figure 2:
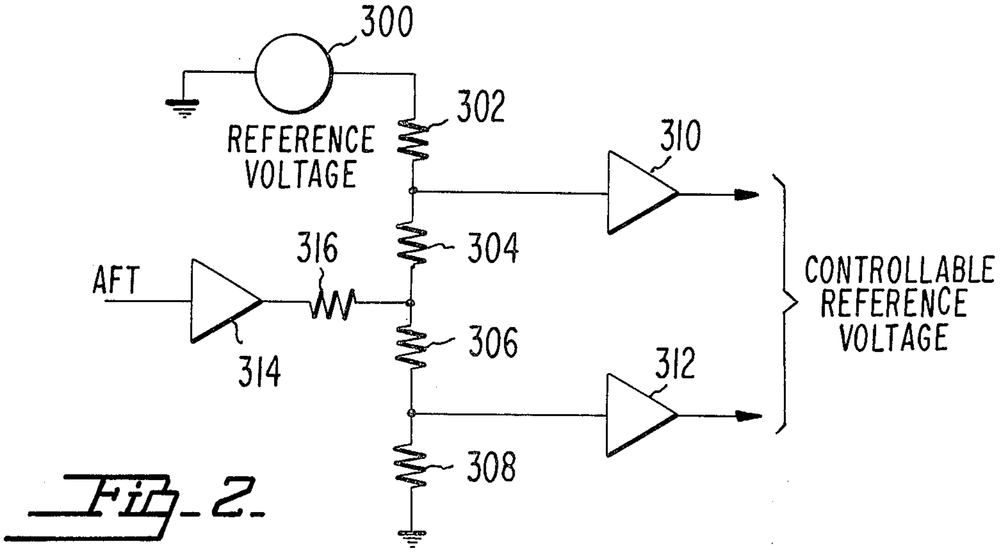
FIG. 2 is a partial block and schematic diagram of controllable reference supply as utilized in the apparatus of FIG. 1.

FIG. 2 illustrates a detailed representation of a controllable reference supply 124. A source of relatively fixed, direct reference voltage 300, which may be derived in numerous ways known in the art, is coupled across the series combination of resistors 302, 304, 306 and 308. A buffer amplifier 310 has a relatively high impedance input terminal coupled to the junction of resistors 302 and 304 and provides, at a relatively low output impedance level, and output voltage proportional to the voltage provided at its input. A second buffer amplifier 312 has a relatively high impedance input terminal coupled to the junction of resistors 306 and 308 and provides, at a relatively low output impedance level, an output voltage proportional to that provided to its input. A third buffer amplifier 314 has an output coupled to the junction of resistors 304 and 306 through a resistor 316 and provides a voltage to the resistor combination 302, 304 and 306, 308 that is proportional to an AFT voltage applied to its input.

In the operation of the above-described circuit, reference voltage 300 provides a current through the series resistor network 302, 304, 306 and 308, which divides this reference voltage with respect to ground into high and low output voltages as formed at the respective junctions of resistors 302, 304 and 306, 308. The high output voltage at the junction of resistors 302 and 304 is coupled through buffer amplifier 310 which decouples the load on the output of this amplifier from the relatively high impedance of resistors 302, 304, 306 and 308. Similarly, the low output voltage provided at the junction of resistors 306 and 308 is coupled to buffer amplifier 312. Buffer amplifier 314 receives AFT voltage from television receiver 122 and provides, at a low source impedance, a voltage proportional to the AFT voltage. The AFT-representative voltage provided at the output of buffer amplifier 314 modulates the voltages provided to buffer amplifier 310 and buffer amplifier 312. Resistors 302, 304, 306, 308 and 316 are selected so that the relative voltage changes at the input terminals of amplifiers 310 and 312, in response to AFT voltage, are in a proportion of 3 to 1. That is, for a one unit change of the AFT signal, the input to buffer amplifier 310 will change three times more than the input to buffer amplifier 312. This provides a desired amount of AFT control at both the high end of the tuning band and at the low end of the tuning band.

Figure 3:
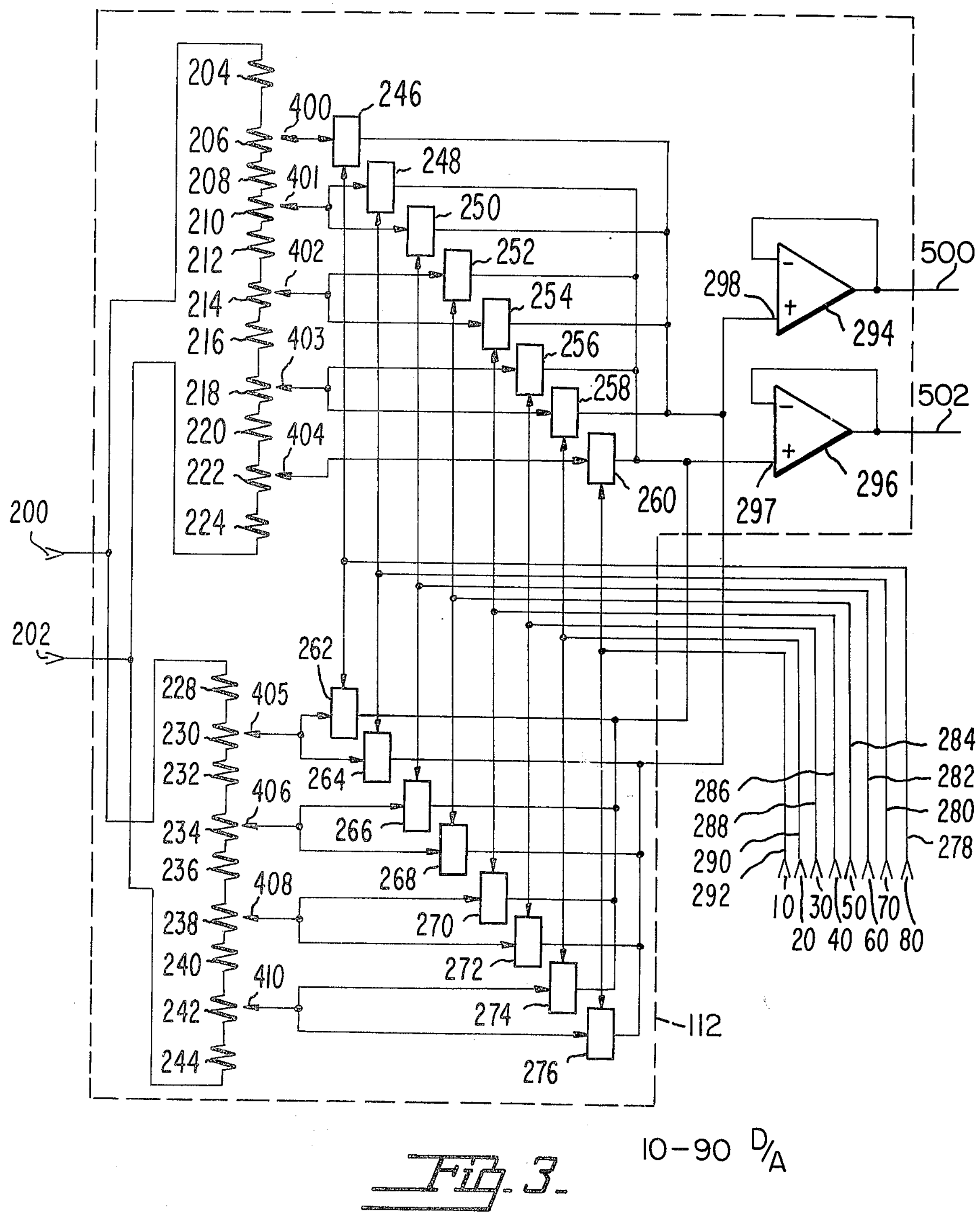
FIG. 3 is a partial block and schematic drawing of a digital to analog converter incorporating the invention.

FIG. 3 illustrates a detailed representation of D/A converter 112 shown in FIG. 1. Input lines 200 and 202 are respectively coupled to the output terminals of buffer amplifiers 310 and 312 (see FIG. 2). A first alternating series of resistors and potentiometers 204–224 is coupled across input terminals 200 and 202. A second alternating series of resistors and potentiometers 228–244 is also coupled across input terminals 200 and 202. Transfer gates 246–260 are respectively coupled to potentiometers 206–222. Similarly, transfer gates 262–276 are respectively coupled to potentiometers 230–242. Output terminals of transfer gates 246, 250, 254 and 258 are coupled in common with output terminals of transfer gates 264, 268, 272, and 276 and input terminal 298 of a buffer amplifier 294. Similarly, output terminals of transfer gates 248, 252, 256 and 260 are coupled in common with output terminals of transfer gates 262, 266, 270 and 274 and an input terminal 297 of a buffer amplifier 296. Terminals 298 and 297 are respective non-inverting inputs of amplifiers 294 and 296. A signal inverting input on each of the respective amplifiers 294 and 296 is coupled to respective output terminals for providing signal feedback and unity gain. Transfer gates 246–260 have control terminals respectively coupled to control terminals of gates 262–276 and respective control lines 278–292. The control lines 278–292 correspond to the "tens" output lines of BCD to decimal converter 104 (FIG. 1).

In the operation of the above-described arrangement, first and second voltages provided by controllable reference supply 124 (see terminals 311 and 313 of FIG. 2) are coupled to terminals 200 and 202. The voltage across these input terminals 200 and 202 is divided by the two series combinations of resistors and potentiometers 204–224 and 228–244. Upon receiving a tens command corresponding numerically to any one of the channel decades 10–80, a signal is applied to the appropriate one of control lines 278–292 by converter 104 (FIG. 1). A signal on one of these control lines causes the transfer gates coupled thereto to close and allow the voltages at their respective input terminals to pass to input terminals of buffer amplifiers 294 and 296 as will be explained in detail below. Amplifiers 294 and 296 have relatively high input impedance and low ouput impedance and provide relatively low current drain to the associated input circuitry while providing a relatively high output current capability. The resistor-potentiometer combination 204–224 are selected and preadjusted such that the voltages provided at the five potentiometer output terminals 400–404 correspond to tuning voltages that respectively tune the UHF portion of tuner 120 to channels 90, 70, 50, 30 and 10. Channels 90 and 10 on a UHF tuner do not correspond to existing television channels, consequently the voltage required to respectively tune the UHF portion of tuner 120 to these two channels are determined by extrapolation of the voltage verses frequency curve of the associated UHF tuner.

The resistor-potentiometer combination 228–244 is preadjusted and selected such that the voltages at the outputs of the four potentiometer output terminals 405–408 correspond to the tuning voltages required to respectively tune tuner 120 to channels 80, 60, 40 and 20. Hence, when a signal is applied to an input line such as line 284, transfer gates 252 and 268 close. Voltages provided at potentiometer output terminals 402 and 406 are respectively coupled through gates 252 and 268 to the respective input terminals an operational amplifiers 294 and 296. The voltage at terminal 402 corresponds to channel 50, while that at terminal 406 corresponds to channel 60. Hence, the output voltages provided by unity gain buffer amplifiers 294 and 296 correspond respectively to channels 60 and 50, the end channels of a series of eleven channels. Similarly, selection of any one of the input control lines 278–292 results in output voltages from amplifiers 294 and 296 which correspond to the end channels of any eleven channel series beginning at channel 10 and ending at channel 90. It should be understood that although channel series 10–20 and 80–90 are referred to with respect to FIGS. 3 and 4, only the respective portions including channels 14–20 and 80–83 correspond to existing UHF television channels that are available for selection by this apparatus.

If a single resistor divider network were used to provide output voltages corresponding to an eleven channel series instead of the two divider arrangement described above, the single divider might not be able to accommodate tuners wherein the voltage required to tune a first tuner, for example, to channel 70 is greater than the voltage required to tune a second tuner to channel 80. This voltage range problem is overcome by utilizing two separate voltage dividers 204–224 and 228–244 to provide voltage outputs at alternate channel decades. Since the voltage at the output of any one potentiometer is not constrained by the maximum or minimum values of the potentiometer associated with an adjacent decade, a relatively wide range of voltage outputs may be derived including that which would be required for the condition noted above. The use of two separate voltage dividers rather than a series of parallel dividers, one for decade, allows for a relatively low current drain from reference source 124 and therefore a greater case in obtaining a stable reference output from source 124.

Figure 4:
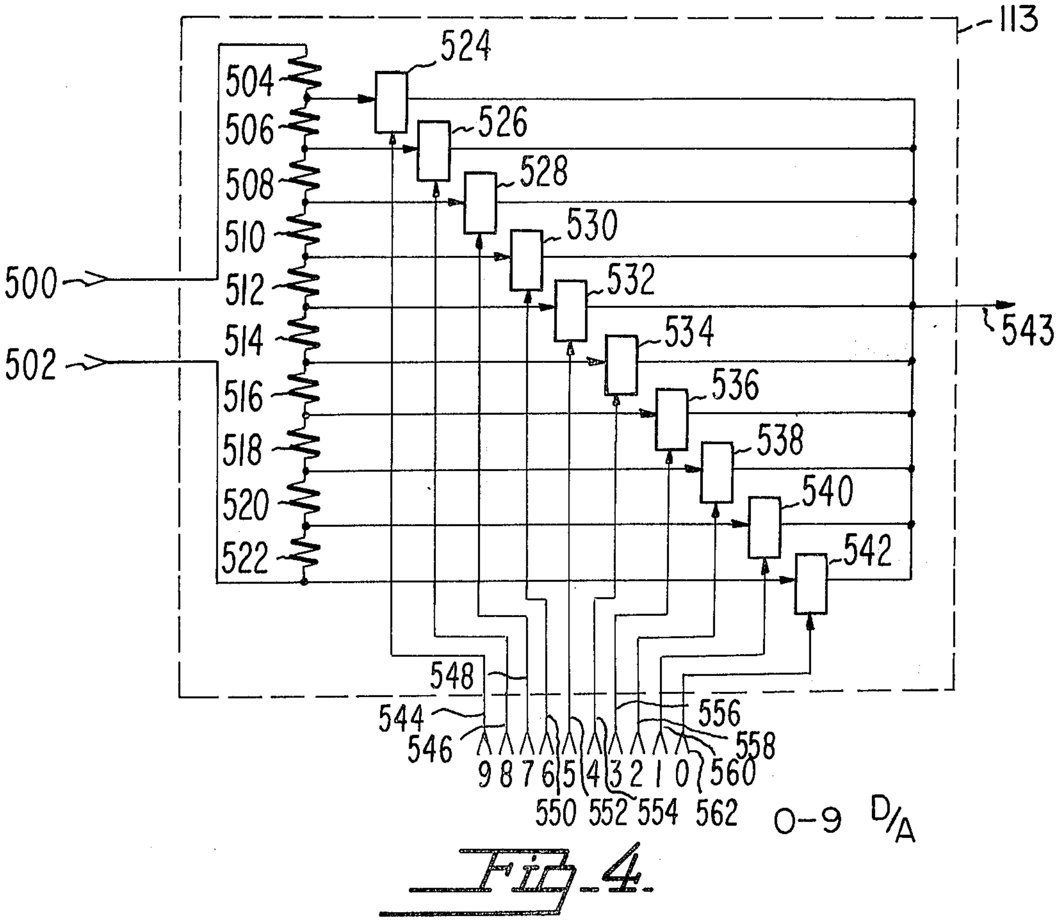
FIG. 4 is a partial block and schematic diagram of a digital to analog converter utilized with the apparatus illustrated in FIG. 3.

FIG. 4 illustrates a digital to analog converter suitable for decoding particular ones of a decade of channels in the channel range provided by the outputs of buffer amplifiers 294 and 296. In FIG. 4, input terminals 500 and 502 are coupled to a series combination of resistors 504–522. Transfer gates 524–540 are respectively coupled to the junction of adjacent resistor elements of resistors 504–522. Transfer gate 542 is coupled to the junction of input line 502 and resistor 522. Outputs from respective transfer gates 524–542 are coupled in common to output terminal 543. Control input terminals of respective transfer gates 524–542 are coupled to input lines 544–562.

In the operation of this digital to analog converter, voltages from D/A converter 112 are coupled to input terminals 500 and 502. The difference in voltage across these two terminals corresponds to the voltage generally required to tune eleven television channels of tuner 120. The voltage on the line 502 corresponds to a channel at one end of the decade to be tuned. Resistors 504–522 subdivide the input voltage into nine additional parts such that the voltages produced at the junctions of adjacent resistor elements correspond to individual television channels. Application of a control signal to one of the ten input lines 544–562 causes a respectively coupled gate to close and pass the tuning voltage provided at its input to output terminal 543.

Although the apparatus of FIG. 3 has been illustrated with first and second voltage dividers 204–224 and 228–244 for providing output voltages corresponding to the end points of a series of eleven channels, other arrangements providing output voltages corresponding to less than eleven channels may be used. For example, a third voltage divider may be added to the apparatus of FIG. 3 in parallel with the above-mentioned dividers. This third divider can then provide output voltages coresponding to channels midway between those provided by the first and second voltage dividers 204–224 and 228–244, i.e., channels 15, 25, 35, etc. The outputs from this third divider can then be selectively coupled to the junction of resistors 512 and 514 in the divider illustrated in FIG. 4. Gates similar to gates 246–260 can be coupled to the outputs of the third voltage divider for providing selective coupling of an appropriate output to the voltage divider of FIG. 4. By adding a third voltage divider, greater accuracy can be achieved in approximating the tuning response curve of tuner 120.

What is claimed is:

1. In a television receiver having at least one voltage controlled tuner, a channel selection system for tuning said voltage controlled tuner comprising:

a source of reference voltage;

first and second resistor ladder networks having a respective first and second plurality of series coupled resistor elements, a respective first and second plurality of output terminals, ones of said first plurality of output terminals being paired with ones of said second plurality of output terminals such that the voltage difference between terminals of said pairs is substantially equal to the voltage required to tune said voltage controlled tuner over a plurality of channels, said ladder networks further having respective input terminals, said input terminals coupled in parallel to said source of reference voltage a channel selection means for providing control signals responsive to selection of particular television channels;

first and second gating means receptive to signals from said channel selection means and respectively coupled to said plurality of output terminals of said first and second ladder networks for providing respective first and second output signals responsive to a selected channel a third resistor ladder network having first and second input terminals respectively coupled to said first and second output terminals of said first and second gating means and a plurality of output terminals; and coupling means responsive to said control signals for coupling a selected one of said output terminals of said third network to said tuner and providing a tuning voltage thereto.

2. Apparatus according to claim 1 wherein said gating means includes:

a plurality of transfer gates having input terminals coupled to respective output terminals of said first and second ladders, output terminals coupled to said third ladder and control terminals coupled to said selecting means.

3. Apparatus according to claim 2 wherein said coupling means includes:

a plurality of gates having input terminals coupled to respective output terminals of said third ladder, control terminals coupled to said selecting means and output terminals coupled in common to said tuner.

4. Apparatus according to claim 3 wherein:

said first and second resistor ladder networks include a plurality of potentiometers coupled to particular ones of said ladder output terminals for varying the voltage provided thereby.

5. Apparatus according to claim 4 wherein said third resistor ladder network includes:

ten series coupled resistors adapted for receiving a current from said source of reference voltage, nine output terminals at the intersections of adjacent resistor elements and a tenth output terminal at an end of said ten series coupled resistors.

6. Apparatus according to claim 5 wherein said channel selection means includes:

a plurality of switches for providing electrical signals responsive to numerical channel commands; and means for storing signals provided by said switches.

7. Apparatus according to claim 6 wherein said means for storing signals includes:

first and second registers for respectively storing signals representative of the tens and units portions of selected television channel number.

8. Apparatus according to claim 3 wherein:

said first resistor ladder network includes a series of at least six resistance elements arranged in series for receiving current from said source of reference voltage and at least five output terminals separated by ones of said resistance elements for providing five different voltages; and said second resistor ladder network includes a series of at least five resistance elements arranged in series for receiving current from said source of reference voltage and at least four output terminals adjacent to different ones of said five resistance elements for providing four different output voltages.

9. Apparatus according to claim 8 wherein said third resistor ladder network includes:

ten series coupled resistors adapted for receiving a current from said source of reference voltage, nine output terminals at the intersections of adjacent resistor elements and a tenth output terminal at an end of said ten series coupled resistors.

10. Apparatus according to claim 9 wherein said channel selection means includes:

a plurality of switches for providing electrical signals responsive to numerical channel commands; and means for storing signals provided by said switches.

11. Apparatus according to claim 10 wherein said means for storing signals includes:

first and second registers for respectively storing signals representative of the tens and units portions of selected television channel number.

12. A channel selector for a television receiver having a voltage controlled tuner comprising:

selecting means for providing an output signal in response to a selected channel;

a source of reference voltage;

a first resistor ladder network having at least six resistance elements arranged in series for receiving current from said source of reference voltage and at least five output terminals separated by ones of said resistance elements for providing five different voltages corresponding to particular television channels;

a second resistor ladder network having at least five resistance elements arranged in series for receiving current from said source of reference voltage and at least four output terminals adjacent to different ones of said five resistance elements for providing four different output voltages that are less than the voltages provided at corresponding output terminals on said first ladder and greater than the voltage provided at a next adjacent output terminal on said first ladder, said output voltage provided by said second ladder further corresponding to particular other television channels;

a third resistor ladder network having a plurality of output terminals and first and second input terminals;

switching means responsive to signals from said selecting means and interposed between said third network and said first and second networks for responsively switching said input terminals of said third network to respective ones of output terminals on said first and second networks such that the voltage on said first input terminal always exceeds the voltage on said second input terminal; and output means responsive to said selecting means for coupling signals from particular ones of said output terminals on said third network to said tuner.

13. Apparatus according to claim 12 wherein said third resistor ladder network includes:

ten series coupled resistors adapted for receiving a current from said source of reference voltage, nine output terminals at the intersections of adjacent resistor elements and a tenth output terminal at an end of said ten series coupled resistors.

14. Apparatus according to claim 13 including:

first and second buffer amplifiers coupled between said switching means and said respective input terminals of said third ladder network for providing a relatively high impedance load on said first and second ladders, and a relatively low impedance for driving said third ladder.

15. Apparatus according to claim 14 wherein said channel selection means includes:

a plurality of switches for providing electrical signals responsive to numerical channel commands; and means for storing signals provided by said switches.

16. Apparatus according to claim 15 wherein said means for storing signals includes:

first and second registers for respectively storing signals representative of the tens and units portions of selected television channel number.

17. A channel selector for a television receiver having a voltage controlled tuner comprising:

selecting means for providing an output signal in response to a selected channel;

a first resistor ladder network having a plurality of output terminals for providing a series of different voltages corresponding to particular television channels, said first resistor ladder network including at least five potentiometers in an alternating series with at least four fixed resistors, said five potentiometers each having an output terminal for providing output voltages each of which can be varied independently by an associated one of said five potentiometers to correspond to a particular television channel;

a second resistor ladder network having at least four potentiometers and at least three fixed resistors arranged in an alternating series, said four potentiometers each having an output terminal for providing respective output voltages each of which can be varied independently by an associated one of said four potentiometers, said last-named output voltages being less than the voltages provided at corresponding output terminals on said first ladder and greater than the voltage provided at a next adjacent output terminal on said first ladder, said output voltages provided by said second ladder further corresponding to particular other television channels;

a third resistor ladder network having a plurality of output terminals and first and second input terminals;

switching means responsive to signals form said selecting means and interposed between said third network and said first and second networks for responsively switching said input terminals of said third network to respective ones of output terminals on said first and second networks such that the voltage on said first input terminal always exceeds the voltage on said second input terminal; and output means responsive to said selecting means for coupling signals from particular ones of said output terminals on said third network to said tuner.

18. Apparatus according to claim 17 wherein said third resistor ladder network includes:

ten series coupled resistors adapted for receiving a current from said source of reference voltage, nine output terminals at the intersections of adjacent resistor elements and a tenth output terminal at an end of said ten series coupled resistors.

* * * * *